US011295982B2

(12) United States Patent
Sakuma et al.

(10) Patent No.: US 11,295,982 B2
(45) Date of Patent: Apr. 5, 2022

(54) FORMING ULTRA-THIN CHIPS FOR FLEXIBLE ELECTRONICS APPLICATIONS

(71) Applicant: INTERNATIONAL BUSINESS MACHINES CORPORATION, Armonk, NY (US)

(72) Inventors: Katsuyuki Sakuma, Fishkill, NY (US); Huan Hu, Yorktown Heights, NY (US); Xiao Hu Liu, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 139 days.

(21) Appl. No.: 16/437,742

(22) Filed: Jun. 11, 2019

(65) Prior Publication Data

US 2020/0395248 A1   Dec. 17, 2020

(51) Int. Cl.
*H01L 21/78* (2006.01)
*H01L 23/31* (2006.01)
(Continued)

(52) U.S. Cl.
CPC ...... *H01L 21/7806* (2013.01); *H01L 21/3065* (2013.01); *H01L 21/561* (2013.01); *H01L 21/6836* (2013.01); *H01L 23/3157* (2013.01); *H01L 2221/6835* (2013.01); *H01L 2221/68381* (2013.01)

(58) Field of Classification Search
CPC .............. H01L 21/6836; H01L 21/7806; H01L 21/6835; H01L 21/568; H01L 21/561
See application file for complete search history.

(56) References Cited

U.S. PATENT DOCUMENTS

| 6,090,648 A | 7/2000 | Reedy et al. |
| 7,855,107 B2 | 12/2010 | Hara |

(Continued)

FOREIGN PATENT DOCUMENTS

| CN | 207601835 U | 7/2018 |
| CN | 108538791 A | 9/2018 |
| IN | 3979DEL2012 | 12/2014 |

OTHER PUBLICATIONS

Chia et al. "Temperature Sensor Array Using Flexible Substrate," MEMS 2007, Jan. 21-25, 2007, pp. 589-592, accessed May 20, 2020.

(Continued)

*Primary Examiner* — Lauren R Bell
(74) *Attorney, Agent, or Firm* — Cantor Colburn LLP; L. Jeffrey Kelly (57) ABSTRACT

A method of fabricating ultra-thin chips is provided. The method includes patterning circuit elements onto a substrate such that sections of the substrate are exposed and etching trenches into the sections of the substrate to define pedestals respectively associated with a corresponding circuit element. The method further includes depositing stressor layer material onto the circuit elements and applying handling tape to the stressor layer material. In addition, the method includes at least one of weakening the substrate in a plane defined by base corners of the pedestals and initiating substrate cracking at the base corners of the pedestals to encourage spalling of the pedestals off the substrate.

9 Claims, 7 Drawing Sheets

(51) Int. Cl.
*H01L 21/3065* (2006.01)
*H01L 21/56* (2006.01)
*H01L 21/683* (2006.01)

(56) References Cited

U.S. PATENT DOCUMENTS

| | | | |
|---|---|---|---|
| 7,968,388 | B2 | 6/2011 | Komatsu |
| 8,168,511 | B2 | 5/2012 | Nishiki et al. |
| 8,916,450 | B2 | 12/2014 | Bedell et al. |
| 9,324,566 | B1 | 4/2016 | Bedell et al. |
| 2003/0231819 | A1 | 12/2003 | Palmer et al. |
| 2010/0311250 | A1 | 12/2010 | Bedell et al. |
| 2011/0003410 | A1* | 1/2011 | Tsay .................. H01L 33/44 438/27 |
| 2011/0220890 | A1 | 9/2011 | Nuzzo et al. |
| 2012/0032212 | A1* | 2/2012 | Huang ............... H01L 21/2654 257/98 |
| 2015/0108525 | A1* | 4/2015 | Chae .................. H01L 33/06 257/98 |
| 2017/0194449 | A1* | 7/2017 | Bedell ............ H01L 31/022433 |
| 2017/0301700 | A1* | 10/2017 | Chen ................. H01L 27/1244 |
| 2018/0212120 | A1* | 7/2018 | Bedell ................ H01L 23/48 |
| 2019/0393069 | A1* | 12/2019 | Paranjpe ............. H01L 25/0753 |
| 2020/0251431 | A1* | 8/2020 | Priewasser ............. H01L 24/04 |

OTHER PUBLICATIONS

Anonymous, "Wearable Technology Market worth 51.60 Billion USD", Online downloaded 2019, URL:<http://www.marketsandmarkets.com/PressReleases/wearable-electronics.asp>, 7 pages.

Aspar et al., "The Generic Nature of the Smart-Cut Process for Thin Film Transfer", Journal of Electronic Materials, 2001, pp. 834-840.

Haupt et al., "Laser Dicing of Silicon: Comparison of Ablation Mechanisms with a Novel Technology of Thermally Induced Stress", Journal of Laser Micro / Nanoengineering, 2008, 7 pages.

Jansen et al., "Black silicon method X: a review on high speed and selective plasma etching of silicon with profile control: an in-depth comparison between Bosch and cryostat DRIE processes as a roadmap to next generation equipment", Journal of Micromechanics and Microengineering, 2009, 42 pages.

Lin et al., "Fabrication of Flexible Transducer Arrays With Through-Wafer Electrical Interconnects Based on Trench Refilling With PDMS", Journal of Microelectromechanical Systems, 2008, 5 pages.

Stephen et al., "Kerf-Less Removal of Si, Ge, and III-V Layers by Controlled Spalling to Enable Low-Cost PV Technologies", IEEE, 2012, pp. 141-147.

* cited by examiner

FORMING ULTRA-THIN CHIPS FOR FLEXIBLE ELECTRONICS APPLICATIONS

BACKGROUND

The present invention generally relates to fabrication methods and resulting structures for semiconductor devices. More specifically, the present invention relates to fabrication methods and resulting structures for ultra-thin chips configured for use in flexible electronics applications.

Ultra-thin and flexible circuits are an increasingly important technological field for certain applications. These applications include, but are not limited to, wearable electronics where traditional electronics that use brittle, thick and inflexible bulk silicon substrate are impractical. The wearable electronics can be used in wearable sensors, for example, which monitor daily activities and can generate healthcare data for computer-based cognitive analysis.

SUMMARY

Embodiments of the present invention are directed to a method of fabricating ultra-thin chips. A non-limiting embodiment of the method includes patterning circuit elements onto a substrate such that sections of the substrate are exposed and etching trenches into the sections of the substrate to define pedestals respectively associated with a corresponding circuit element. The non-limiting embodiment of the method further includes depositing stressor layer material onto the circuit elements and applying handling tape to the stressor layer material. In addition, the non-limiting embodiment of the method includes at least one of weakening the substrate in a plane defined by base corners of the pedestals and initiating substrate cracking at the base corners of the pedestals to encourage spalling of the pedestals off the substrate.

Embodiments of the present invention are directed to a method of fabricating ultra-thin chips. A non-limiting embodiment of the method includes patterning circuit elements onto a substrate such that sections of the substrate are exposed and etching trenches into the sections of the substrate to define pedestals respectively associated with a corresponding circuit element. The non-limiting embodiment of the method further includes depositing stressor layer material onto the circuit elements with the trenches masked to form stressor elements disposed locally on the circuit elements and applying handling tape to the stressor elements. In addition, the non-limiting embodiment of the method includes at least one of weakening the substrate in a plane defined by base corners of the pedestals and initiating substrate cracking at the base corners of the pedestals to encourage spalling of the pedestals off the substrate.

Embodiments of the invention are directed to an assembly of ultra-thin chips. A non-limiting example of the assembly includes circuit elements, handling tape and stressor layer material. The stressor layer material is interposed between a first side of each of the circuit elements and the handling tape. The non-limiting embodiment of the assembly further includes pedestals. Each pedestal has a first side coupled to a second side of each of the circuit elements and a second side substantially parallel with the first side.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various ele-

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, flexible electronics have recently been fabricated using a process that relies on spalling to remove a circuit and a flexible substrate from a bulk silicon substrate. In these cases, the spalling processing involves spalling mode fracturing of the bulk silicon substrate due to a presence of a tensile layer which generates an opening mode stress acting on a crack tip and creates a shear field as the tensile layer contracts. As such, the spalling processing has exhibited certain disadvantages. These include, but are not limited to, the fact that initiation of a crack and boundary control of the crack can be difficult, the fact that a resulting roughened surface can degrade performance and compromise reliability, and the fact that a thickness of the flexible electronics is limited by a magnitude of intrinsic stress of the tensile layer. Indeed, the limit on thickness is such that it has been difficult to achieve thin films that are sufficiently thin to meet demands for ultra-thin films for wearable electronics.

Turning now to an overview of the aspects of the invention, one or more embodiments of the invention address the above-described shortcomings of the prior art by providing a method of fabricating ultra-thin chips in which a bulk silicon substrate is etched prior to a peeling operation of a spalling process in order to define a device or chip boundary precisely. This etching creates a stress concentration at a corner of the device or chip (i.e., an initiation spot) that helps to initiate and control cracking.

The above-described aspects of the invention address the shortcomings of the prior art by providing for a method of fabricating ultra-thin (less than about 20 µm thick) flexible chips from a substrate (i.e., a wafer or panel) in a batch process for large quantities. The method includes a formation of an initiation site and a pre-defined path for delamination to enable the production of ultra-thin chips with clean boundaries and smooth surfaces. The precision of the initiation site is characterized as being a site of localized stress concentrations within a trench or, more particularly, a right angled or acute trench. The pre-defined path for delamination is defined by a weakening interface or lowered cohesion. In various cases, a top metal film may or may not be required and, while the overall method is front end of line (FEOL) process compatible or back end of line (BEOL) process compatible, the method is not limited to uses with silicon substrates.

Figure 1:
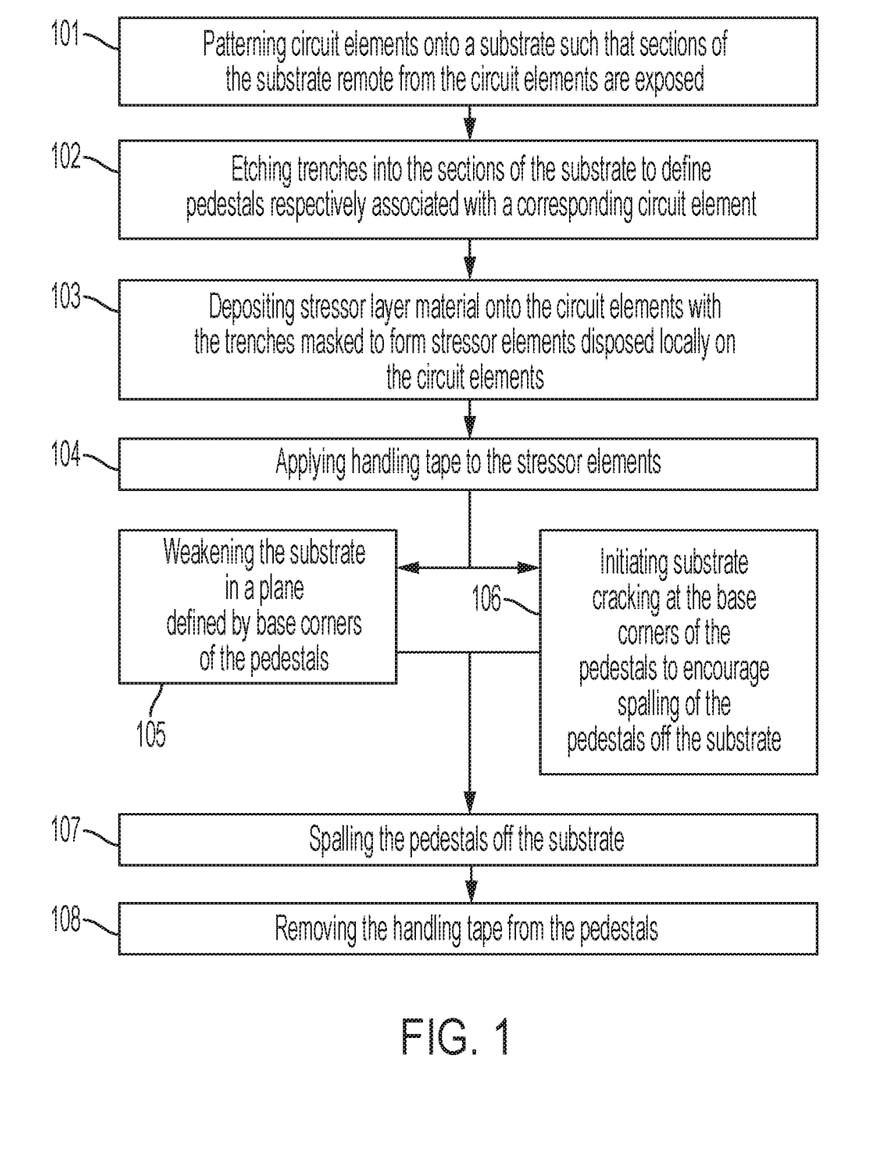
FIG. 1 is a flow diagram illustrating a method of fabricating ultra-thin chips in accordance with embodiments of the present invention.

Turning now to a more detailed description of aspects of the present invention, FIG. 1 is a flow diagram illustrating a method of fabricating ultra-thin chips in accordance with embodiments of the present invention.

As shown in FIG. 1, the method includes patterning circuit elements onto a substrate such that sections of the substrate remote from the circuit elements are exposed 101 and etching trenches into the sections of the substrate to define pedestals respectively associated with a corresponding circuit element 102. The patterning of operation 101 can include applying photoresist to the circuit elements and the substrate and executing a lithographic process to form the photoresist into photoresist pedestals and to expose the sections of the substrate between the photoresist pedestals. The photoresist pedestals can be wider than the circuit elements and can be removed following the etching. The etching can include at least one or more of isotropic etching, anisotropic etching, using ion angular distribution and decreasing ion acceleration speed and can result in base corners of the pedestals being substantially coplanar and in the base corners being right angled, acute or obtuse.

In accordance with aspects of the present invention, the circuit elements and the corresponding pedestals can have a combined thickness of less than about 20 µm.

As also shown in FIG. 1, the method further includes depositing stressor layer material onto the circuit elements with the trenches masked to form stressor elements disposed locally on the circuit elements 103 and applying handling tape to the stressor elements 104. The depositing of the stressor layer material can include spincoating photoresist onto the circuit elements and the pedestals and into the trenches, executing a lithographic process to form the photoresist into photoresist pedestals respectively disposed in a corresponding trench, depositing the stressor layer material onto the circuit elements and the photoresist pedestals and lifting the photoresist pedestals with the stressor layer material deposited thereon from the corresponding trenches.

In addition, as shown in FIG. 1, the method can include at least one or more of weakening the substrate in a plane defined by base corners of the pedestals 105 and initiating substrate cracking at the base corners of the pedestals to encourage spalling of the pedestals off the substrate 106. The weakening of the substrate can include at least one or more of laser ablation, laser assisted spalling processing and implantation damaging.

Once the substrate is weakened or the substrate cracking is initiated, the method can also include spalling of the pedestals off of the substrate 107 and subsequent removal of the handling tape from the stressor elements 108.

The method of fabricating ultra-thin chips will now be described in greater detail with reference to FIG. 2A to FIG. 12.

Figure 2A:
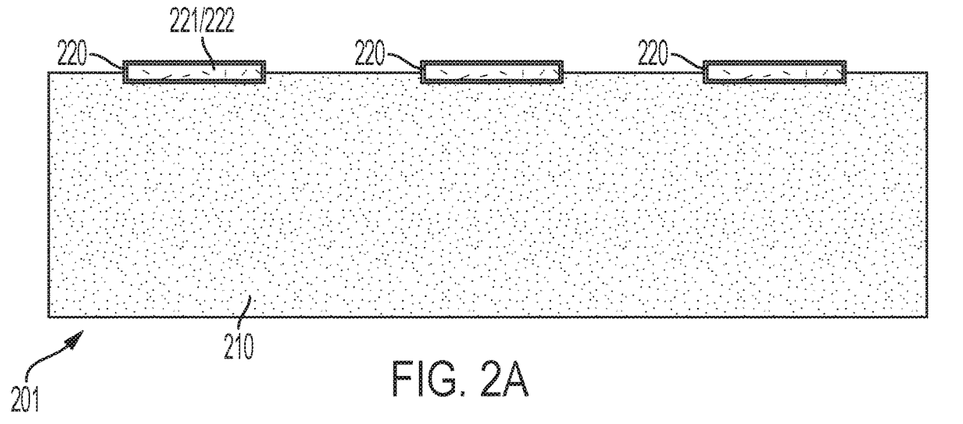
FIG. 2A depicts a side view of an initial structure of a process of fabricating ultra-thin chips in accordance with embodiments of the present invention.
Figure 2B:
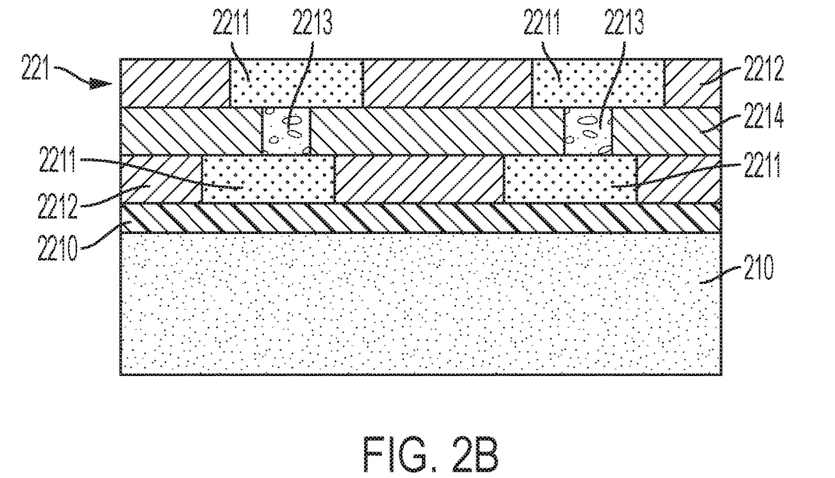
FIG. 2B depicts an enlarged side view of a circuit element of the initial structure of FIG. 2A.
Figure 2C:
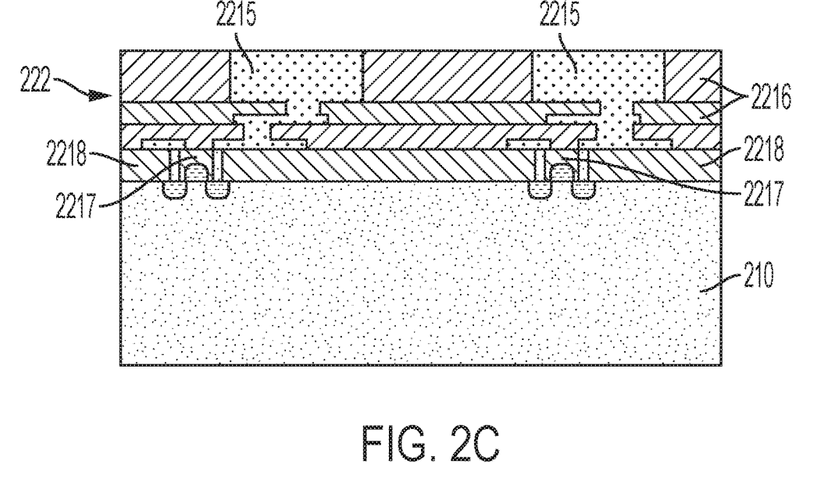
FIG. 2C depicts an enlarged side view of a circuit element of the initial structure of FIG. 2A.

FIG. 2A depicts a side view of an initial structure 201 that results from performing initial operations of a process of fabricating ultra-thin chips in accordance with embodiments of the present invention, and FIGS. 2B and 2C depict enlarged side views of circuit elements 220 of the initial structure 201 shown in FIG. 2A. As shown in FIG. 2A, the initial structure 201 includes a bulk substrate 210 that can be made of silicon, III-V semiconductor materials and other similar materials and circuit elements 220. The circuit elements 220 can be patterned in accordance with various designs and applications and can be provided as sensors 221 (see FIG. 2A) or as combinations of FEOL and BEOL devices 222 (see FIG. 2C). In the former case, as shown in FIG. 2B, the sensors 221 can include a cap layer 2210 that is disposed on the bulk substrate 210, upper and lower interconnects 2211 within layers 2212 of dielectric materials and a device or via 2213 within a layer 2214 of dielectric material and electrically interposed between the upper and lower interconnects 2211. The device or via 2213 can include or be provided as a metallic resistor to measure temperatures, a metallic resistor with piezo-resistive properties, a strain sensor, etc. In the latter case, as shown in FIG. 2C, the combinations of the FEOL and BEOL devices 222 can include interconnect via and line elements 2215 within layers 2216 of dielectric material and device or transistor elements 2217, which are disposed within layers 2218 of dielectric materials and which are electrically interposed between the bulk substrate 210 and the interconnect via and line elements 2215.

Figure 3:
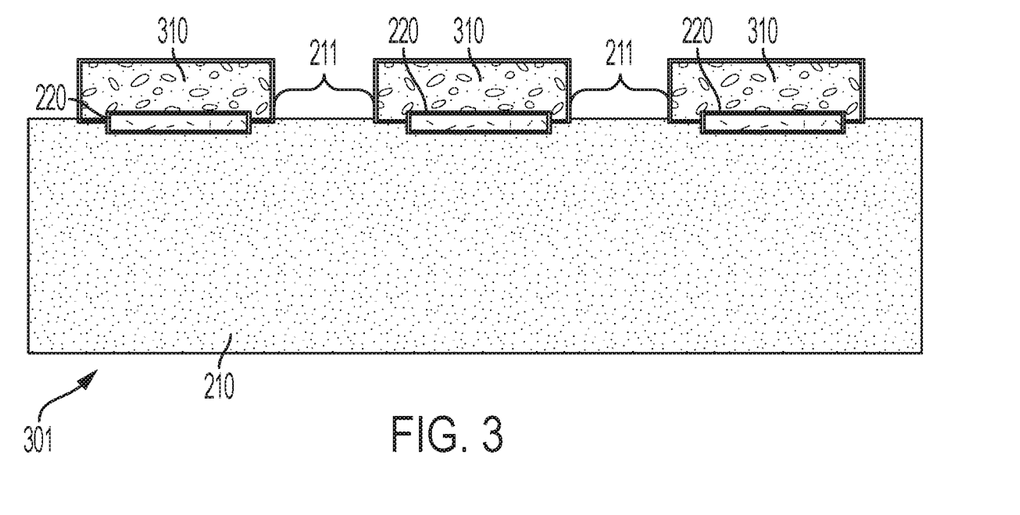
FIG. 3 depicts a side view of an early stage intermediate structure of a process of fabricating ultra-thin chips in accordance with embodiments of the present invention.

FIG. 3 depicts a side view of an early stage intermediate structure 301 of the process of fabricating ultra-thin chips in accordance with embodiments of the present invention following deposition of photoresist and an execution of a lithographic process being conducted with respect to the initial structure 201 of FIG. 2A. The early stage intermediate structure 301 includes photoresist pedestals 310 that are respectively disposed over corresponding circuit elements 220. The photoresist pedestals 310 can be similar in size or slightly wider than the circuit elements 220. The photoresist pedestals 310 effectively mask the circuit elements 220 and the proximal sections of the bulk substrate 210 while exposing sections 211 of the bulk substrate 210 that are disposed remotely from the circuit elements 220.

Figure 4:
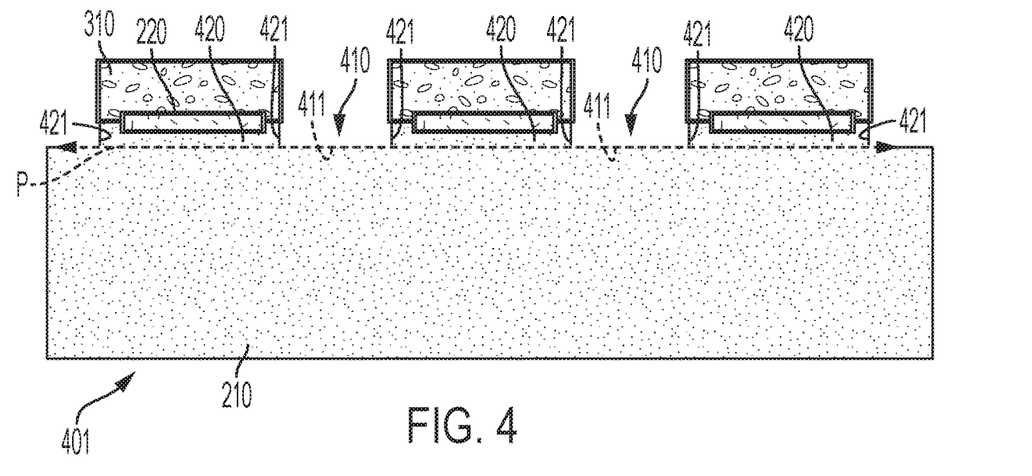
FIG. 4 depicts a side view of another early stage intermediate structure of a process of fabricating ultra-thin chips in accordance with embodiments of the present invention.

FIG. 4 depicts a side view of another early stage intermediate structure 401 of the process of fabricating ultra-thin chips in accordance with embodiments of the present invention following etching being conducted with respect to the early stage intermediate structure 301 of FIG. 3. The etching can include at least one or more of isotropic etching, anisotropic etching, the use of ion angular distribution and a decreasing of ion acceleration speed. In any case, the etching serves to remove material from the bulk substrate 210 from the exposed sections (see FIG. 3) to thus form trenches 410 between neighboring circuit elements 220 and corresponding photoresist pedestals 310.

In accordance with embodiments of the present invention, the etching of FIG. 4 can continue into the bulk substrate 210 or can be designed and executed to continue only into the cap layer 2210 of FIG. 2B. The following description will relate to the case in which the etching continues into the bulk substrate, however, for purposes of clarity and brevity.

The etching also serves to define substrate pedestals 420. The substrate pedestals 420 protrude from a plane P of lower walls 411 of the trenches 410 and include sidewalls 421. A maximum width of each substrate pedestal 420 can be similar to the width of the corresponding photoresist pedestal 310 and can be wider than the corresponding circuit element 220.

Figure 5:
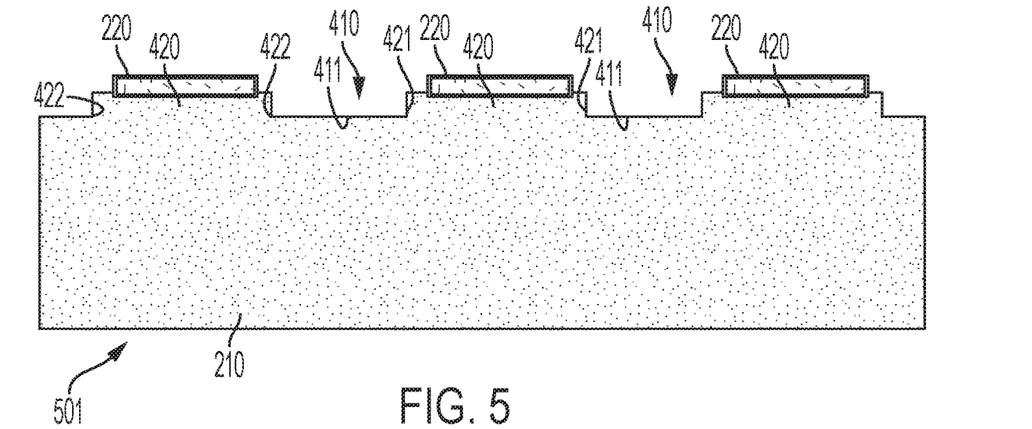
FIG. 5 depicts a side view of a middle stage intermediate structure of a process of fabricating ultra-thin chips in accordance with embodiments of the present invention.
Figure 6:
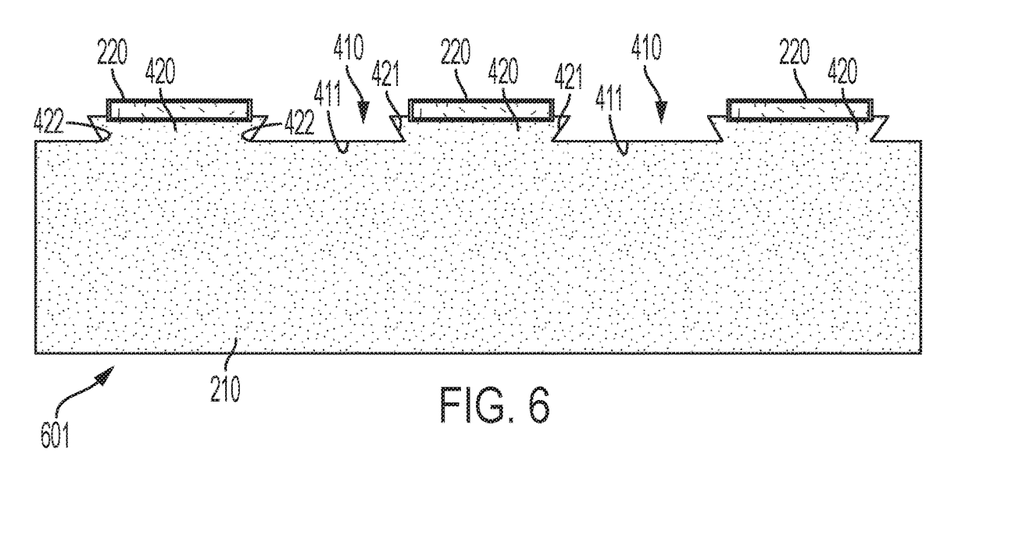
FIG. 6 depicts a side view of a middle stage intermediate structure of a process of fabricating ultra-thin chips in accordance with additional or alternative embodiments of the present invention

FIGS. 5 and 6 depict side views of middle stage intermediate structures 501 and 601 of the process of fabricating ultra-thin chips in accordance with embodiments and additional or alternative embodiments of the present invention following removal of the photoresist pedestals 310 from the circuit elements 220 and the substrate pedestals 420. As shown in FIG. 5, the substrate pedestals 420 are right-angled with the sidewalls 421 extending vertically upwardly from the lower walls 411 of the trenches 410 and can be achieved by the etching be executed as an isotropic etching process. As shown in FIG. 6, the substrate pedestals 420 are acute with the sidewalls 421 extending at an acute angle with respect to the lower walls 411 of the trenches 410 and can be achieved by the etching be executed as an anisotropic etching process, for example.

In either case, the lower base corners 422 of the substrate pedestals 420 are substantially coplanar and are disposed within the plane P (see FIG. 4) or serve to define or help to define the plane P (see FIG. 4) as being substantially parallel with an original uppermost surface of the bulk substrate 210. The lower base corners 422 are also locations of stress concentrations that can be used during subsequent processing to encourage and execute spalling.

The following description will generally relate to the case of the substrate pedestals 420 are right-angled with the sidewalls 421 extending vertically upwardly from the lower walls 411 of the trenches 410 as shown in FIG. 5. This is being done for purposes of clarity and brevity and does not limit the scope of the application in any way.

Figure 7:
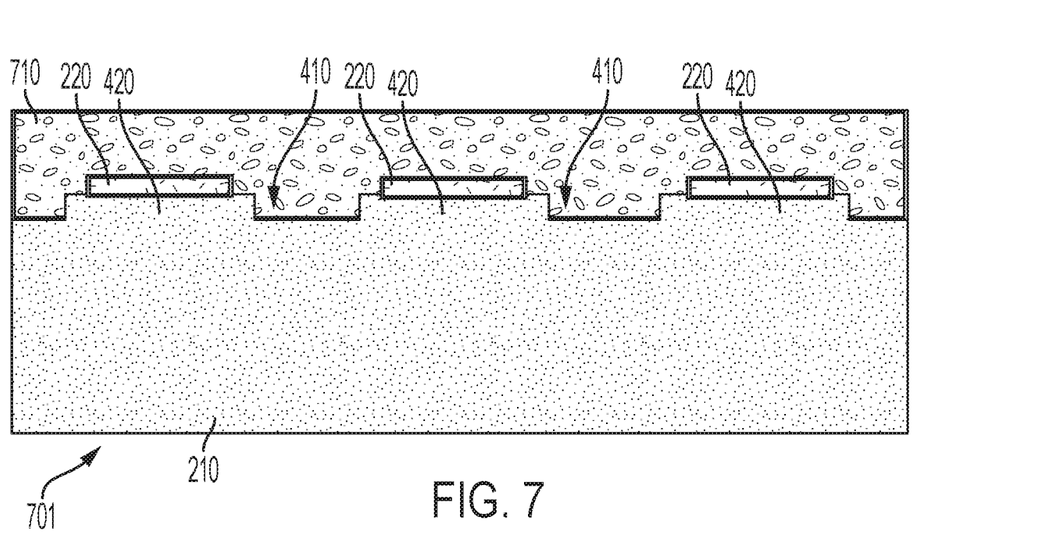
FIG. 7 depicts a side view of another middle stage intermediate structure of a process of fabricating ultra-thin chips in accordance with embodiments of the present invention.

FIG. 7 depicts a side view of another middle stage intermediate structure 701 of the process of fabricating ultra-thin chips in accordance with embodiments of the present invention following a spincoating deposition of photoresist to form a spincoat photoresist layer 710 over the circuit elements 220, the substrate pedestals 420 and the trenches 410.

Figure 8:
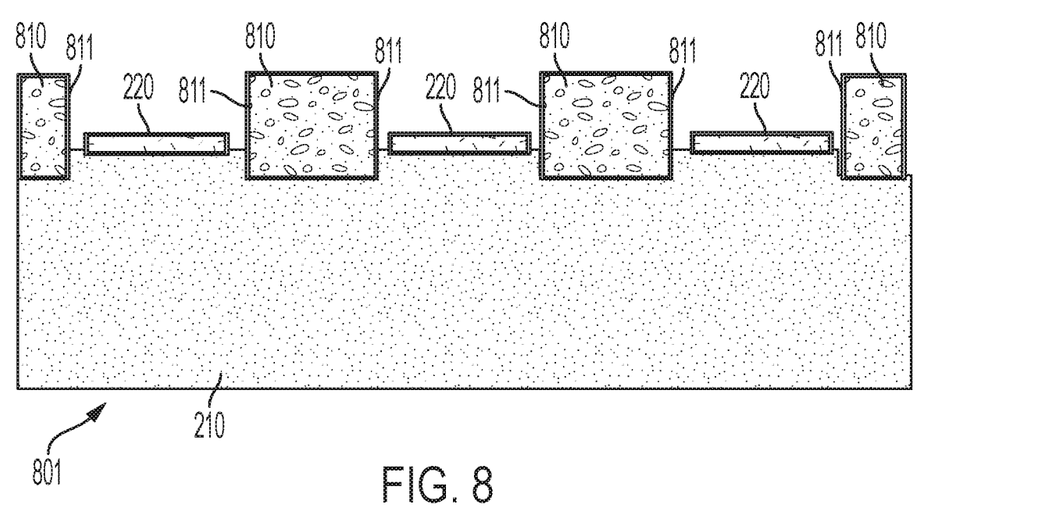
FIG. 8 depicts a side view of another middle stage intermediate structure of a process of fabricating ultra-thin chips in accordance with embodiments of the present invention.

FIG. 8 depicts a side view of another middle stage intermediate structure 801 of the process of fabricating ultra-thin chips in accordance with embodiments of the present invention following execution of a lithographic process with respect to the spincoat photoresist layer 710 of FIG. 7. The execution of the lithographic process results in the spincoat photoresist layer 710 of FIG. 7 being converted into spincoat photoresist pedestals 810 that are respectively disposed in corresponding trenches 410. As shown in FIG. 8, each spincoat photoresist pedestal 810 has a width which is similar to the width of the corresponding trench 410 and sidewalls 811 that are displaced from complementary sidewalls of the adjacent circuit elements 220.

Figure 9:
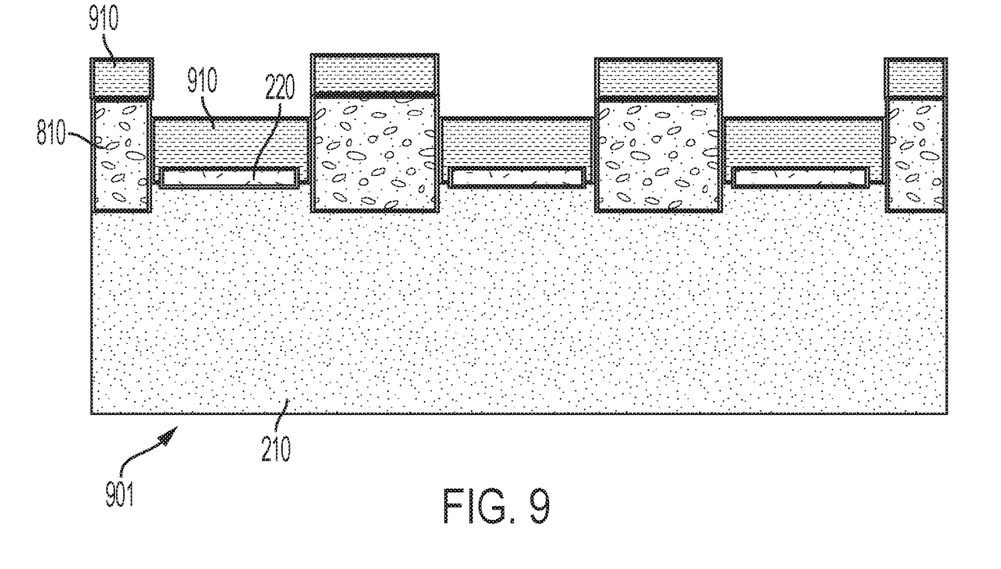
FIG. 9 depicts a side view of a late stage intermediate structure of a process of fabricating ultra-thin chips in accordance with embodiments of the present invention.

FIG. 9 depicts a side view of a late stage intermediate structure 901 of the process of fabricating ultra-thin chips in accordance with embodiments of the present invention following deposition of stressor layer material 910 onto the circuit elements 220 and the spincoat photoresist pedestals 810.

Figure 10:
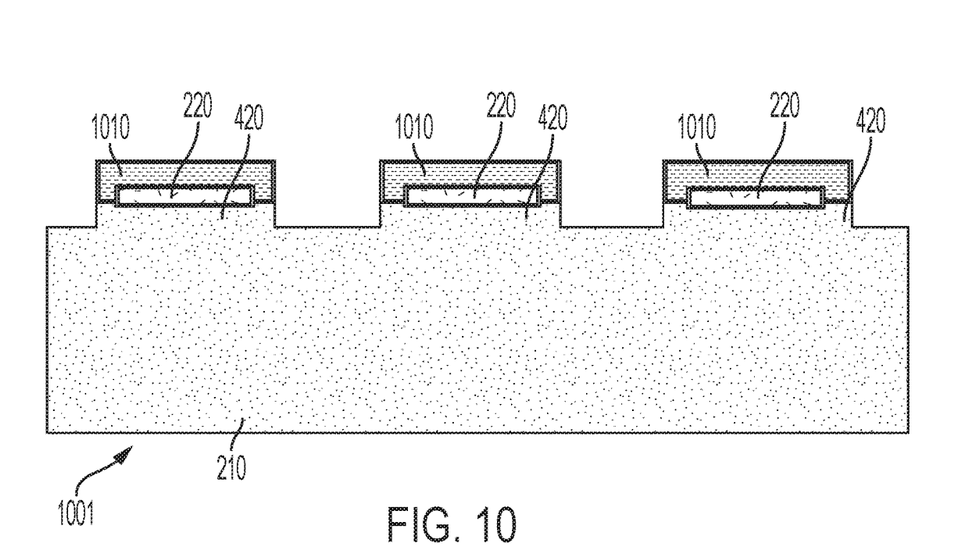
FIG. 10 depicts a side view of another late stage intermediate structure of a process of fabricating ultra-thin chips in accordance with embodiments of the present invention.

FIG. 10 depicts a side view of another late stage intermediate structure 1001 of the process of fabricating ultra-thin chips in accordance with embodiments of the present invention following a lifting off process executed with respect to the spincoat photoresist pedestals 810 of FIGS. 7-9. As shown in FIG. 10, once the lifting off process is completed, the remaining stressor layer material 910 (see FIG. 9) is located on the circuit elements 220 as stressor elements 1010 that each have a width which is similar to the width of the corresponding substrate pedestal 420 and which is wider than the corresponding circuit element 220.

Figure 11:
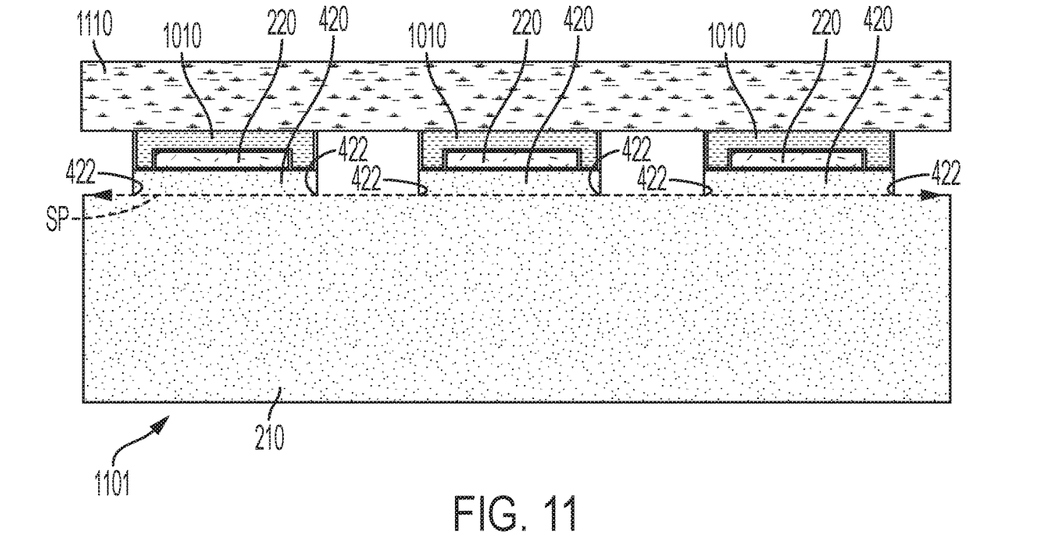
FIG. 11 depicts a side view of a nearly completed structure of a process of fabricating ultra-thin chips in accordance with embodiments of the present invention.

FIG. 11 depicts a side view of a nearly completed structure 1101 of the process of fabricating ultra-thin chips in accordance with embodiments of the present invention following an application of a handling tape layer 1110 to uppermost surfaces of the stressor elements 1010 of FIG. 10 and the formation of a spalling plane SP. The spalling plane SP is defined by the lower base corners 422 of the substrate pedestals 420 and is a site of a weakened interface or lowered cohesion along the spalling plane SP. The weakened interface and the lowered cohesion can be achieved by the presence of the stress concentrations at the lower base corners 422 along the spalling plane SP as well as by additional processing.

The additional processing can include, but is not limited to, at least one or more of laser ablation, laser assisted spalling processing and implantation damaging with an optional heat treatment. Laser ablation works by carving a groove hole in the bulk substrate 210 at or near the spalling plane SP and can lead to thermal effects with a relatively small heat-affected zone, limited collateral damage and precision machining. The laser assisted spalling processing forms a mechanical damage layer in a localized point near the light focus area at or near the spalling plane SP so that material of the bulk substrate 210 can be removed precisely from the bulk substrate 210 at or near the spalling plane SP. Implantation damaging can involve the use of hydrogen implantation or other similar types of implantation to create a damaged interface along the spalling plane SP (e.g., when hydrogen implantation with doses in the range of $10^{16}$ to $10^{17}$/cm2, no defects are observed close to the uppermost surface of the bulk silicon 210, but micro-cavities can be confined around the spalling plane SP and thermal treatment can further induce the growth of these micro-cavities). In each case, the additional processing is conducted in order to further weaken the interface and/or to further reduce cohesion along the spalling plane SP and to thereby encourage or facilitate spalling of the pedestals 420 off of the bulk substrate 210.

Figure 12:
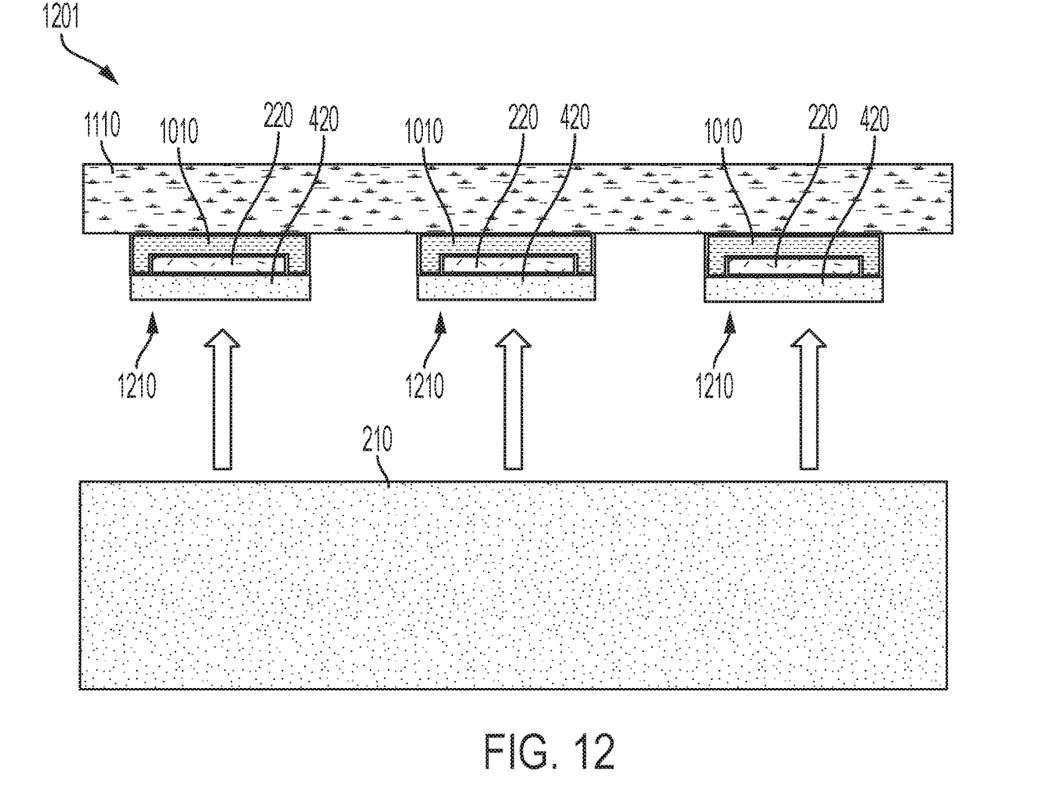
FIG. 12 depicts a side view of a completed structure of a process of fabricating ultra-thin chips in accordance with embodiments of the present invention.

FIG. 12 depicts a side view of a completed structure 1201 of the process of fabricating ultra-thin chips in accordance with embodiments of the present invention following spalling of the substrate pedestals 420 from the remainder of the bulk substrate 210. Subsequent processing can include the removal of each of the ultra-thin chips 1210 from the handling tape layer 1110 of FIG. 11 such that each ultra-thin chip 1210 has a thickness of about 20 µm or less and includes the circuit element 220, the corresponding substrate pedestal 420 and the corresponding stressor element 1010.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating ultra-thin chips, the method comprising:

patterning circuit elements onto a substrate such that sections of the substrate are exposed;

etching trenches into the sections of the substrate to define pedestals respectively associated with a corresponding circuit element of the circuit elements;

depositing stressor layer material onto the circuit elements; and applying handling tape to the stressor layer material, the method further comprising at least one of:

weakening the substrate in a plane defined by base corners of the pedestals, and initiating substrate cracking at the base corners of the pedestals to encourage spalling of the pedestals off the substrate;

wherein the depositing of the stressor layer material comprises:

spincoating photoresist onto the circuit elements and the pedestals and into the trenches;

executing a lithographic process to form the spincoat photoresist into spincoat photoresist pedestals respectively disposed in a corresponding trench of the trenches;

depositing the stressor layer material onto the circuit elements and the spincoat photoresist pedestals; and lifting the spincoat photoresist pedestals with the stressor layer material deposited thereon from the corresponding trenches.

2. The method according to claim 1, wherein the spincoat photoresist pedestals are wider than the circuit elements.

3. The method according to claim 1, further comprising removing the spincoat photoresist pedestals.

4. The method according to claim 1, wherein the base corners of the pedestals are substantially coplanar.

5. The method according to claim 1, wherein the base corners of the pedestals are acute.

6. The method according to claim 1, wherein the etching comprises at least one of isotropic etching, anisotropic etching, using ion angular distribution and decreasing ion acceleration speed.

7. The method according to claim 1, wherein, in case the method further comprises the weakening of the substrate, the weakening of the substrate comprises at least one of laser ablation, laser assisted spalling processing and implantation damaging.

8. The method according to claim 1, wherein the circuit elements and the corresponding pedestals have a thickness of less than about 20 µm.

9. A method of fabricating ultra-thin chips, the method comprising:

patterning circuit elements onto a substrate such that sections of the substrate are exposed;

etching trenches into the sections of the substrate to define pedestals respectively associated with a corresponding circuit element of the circuit elements;

depositing stressor layer material onto the circuit elements with the trenches masked to form stressor elements disposed locally on the circuit elements; and     applying handling tape to the stressor elements, the method further comprising at least one of:

weakening the substrate in a plane defined by base corners of the pedestals, and     initiating substrate cracking at the base corners of the pedestals to encourage spalling of the pedestals off the substrate;

wherein the depositing of the stressor layer material comprises:

spincoating photoresist onto the circuit elements and the pedestals and into the trenches;

executing a lithographic process to form the spincoat photoresist into spincoat photoresist pedestals each being respectively disposed in a corresponding trench of the trenches;

depositing the stressor layer material onto the circuit elements and the spincoat photoresist pedestals; and     lifting the spincoat photoresist pedestals with the stressor layer material deposited thereon from the corresponding trenches.

\* \* \* \* \*